(12) United States Patent
Bauer et al.

(10) Patent No.: US 10,775,950 B2
(45) Date of Patent: Sep. 15, 2020

(54) INPUT DEVICE WITH A MOVABLE HANDLING MEANS ON A CAPACITIVE DETECTION SURFACE AND A REDUNDANT CAPACITIVE POTENTIAL COUPLING

(71) Applicant: PREH GMBH, Bad Neustadt a. d. Saale (DE)

(72) Inventors: Norbert Bauer, Bad Neustadt a.d. Saale (DE); Thomas Kleffel, Höchberg (DE)

(73) Assignee: PREH GMBH, Bad Neustadt a. d. Saale (DE)

( * ) Notice: Subject to any disclaimer, the term of this patent is extended or adjusted under 35 U.S.C. 154(b) by 0 days.

(21) Appl. No.: 16/534,387

(22) Filed: Aug. 7, 2019

(65) Prior Publication Data
US 2020/0064951 A1 Feb. 27, 2020

(30) Foreign Application Priority Data
Aug. 23, 2018 (DE) .......................... 10 2018 120 576

(51) Int. Cl.
G06F 3/044 (2006.01)
G06F 3/041 (2006.01)
H03K 17/955 (2006.01)

(52) U.S. Cl.
CPC ............ G06F 3/044 (2013.01); G06F 3/0412 (2013.01); H03K 17/955 (2013.01)

(58) Field of Classification Search
CPC ...... G06F 3/044; G06F 3/0412; H03K 17/955
See application file for complete search history.

(56) References Cited

U.S. PATENT DOCUMENTS

2017/0115136 A1* 4/2017 Kurte .................... G01D 5/2412
2019/0391672 A1* 12/2019 Fischer .................... G06F 3/044

FOREIGN PATENT DOCUMENTS

| DE | 102011007112 A1 | 10/2012 |
| DE | 102015118083 A1 | 4/2017 |
| WO | 2018137944 A1 | 8/2018 |

* cited by examiner

*Primary Examiner* — Peter D McLoone
(74) *Attorney, Agent, or Firm* — M&B IP Analysts, LLC

(57) ABSTRACT

The invention relates to an input device including: a capacitive detector with a detection surface forming an array of electrodes; an electronic evaluation unit electrically connected to the electrodes and forming an associated array of electrical measuring fields for the spatially resolving detection of a capacitive influence on the detection surface; a handling means disposed on the detection surface in a manner movable along an adjustment path to perform an operating input by means of a movement by an operator; a coupling electrode assembly which is partially moved along with the handling means and disposed in an electrically insulated manner with respect to the operator while they touch the handling means, and where at least one position of the handling means is provided where two measuring fields are capacitively influenced by a means of the coupling electrode assembly, where these influences are detected to obtain position information.

14 Claims, 4 Drawing Sheets

INPUT DEVICE WITH A MOVABLE HANDLING MEANS ON A CAPACITIVE DETECTION SURFACE AND A REDUNDANT CAPACITIVE POTENTIAL COUPLING

This application claims priority to the German Application No. 10 2018 120 576.7, filed Aug. 23, 2018, now pending, the contents of which are hereby incorporated by reference.

The present disclosure relates to an input device having a capacitive detection device, wherein the detection device in each case has a detection surface while forming an array of electrodes associated with the detection surface, and wherein a handling means is movably disposed on the detection surface defined by the detection device and the detection device is configured for detecting the position of the handling means. The present disclosure moreover relates to a corresponding method for capacitive position detection. For example, the capacitive detection device is a capacitive touchpad or a capacitive touchscreen. The input device further includes an electronic evaluation unit, which is connected in an electrically conducting manner to the electrodes, in order to form, by means of the electrode array, an associated array of measuring capacitances, which is preferably generated in a sequence in time, for the spatially resolving detection of a capacitive influence on the input surface. The input device includes a handling means, which is movably disposed on the detection surface in order to perform an operating input when the handling means is moved, in particular when the handling means is manually moved while being touched by an operator. Furthermore, the handling means comprises a coupling electrode assembly in order to cause at least one of the measuring capacitances to be detectably influenced, from which position and/or movement information can be derived. Such a combination of a touchpad or touchscreen with a handling means movably disposed thereon is becoming increasingly popular, because flexible inputting options are being provided in this manner, and because a variety of functions and function information can be associated with the handling means particularly in the case of a touchscreen, due to the flexible displaying options. On the other hand, however, the handling means provides a familiar haptic feedback and can easily be located by feel by the driver without any visual contact. Because of the intended utilization for position detection of the region of the capacitive electrode structure which is located underneath the rotary adjuster and covered by the rotary adjuster, a capacitive coupling between the handling means and the capacitive touchscreen or touchpad is required. For example, this coupling is provided by an electrode assembly which is in an electrically conducting contact with the operator grasping the handling means. It was found that the establishment of this contact is unreliable, so that the detection of the position of the handling means is unreliable.

Against this background, there was a demand for a generic input device in which an improved capacitive coupling is obtained between the capacitive detection device, e.g. the capacitive touchscreen, and the handling means. This object is achieved by an input device according to claim 1. An equally advantageous use and a method for positional evaluation are each the subject matter of the independent claims. Advantageous embodiments are in each case the subject matter of the dependent claims. It must be noted that the features cited individually in the claims can be combined with each other in any technologically meaningful manner and represent other embodiments of the present disclosure.

The description, in particular in connection with the figures, additionally characterizes and specifies the invention present disclosure.

The present disclosure relates to an input device including a capacitive detection device, in which case the detection device has a detection surface while forming an array of electrodes associated with the detection surface. For example, the electrodes are disposed in a common plane or on two or more parallel planes. For example, the detection device is a capacitive touchpad or a capacitive touchscreen. According to the present disclosure, an electronic evaluation unit is provided, which is electrically connected, preferably in an electrically conducting manner, to the electrodes, in order to form, by means of the array of electrodes, an associated array of electrical measuring fields, which is preferably generated in a sequence in time and varies in time, for the spatially resolving detection of a capacitive influence on the detection surface. For example, this is a capacitive detection device with a projected capacitive technology, in particular with a self-capacitance structure or a mutual-capacitance structure. In the so-called self-capacitance structure, each individual electrode is electrically connected to the evaluation unit, and the evaluation unit scans all electrodes during detection. If the measuring field, or the measuring capacitance, is influenced by the external approach of an object, e.g. by the approach of the coupling electrode assembly described below, this is detected and can be associated with a location on the detection surface due to the individual electrical connection with the respective electrode. In the mutual-capacitance structure, measuring fields, and thus measuring capacitances, are generated at intersection points between two electrically insulated intersecting electrode structures. The evaluation unit is capable of measuring the measuring capacitance of each individual intersection point. If the respective measuring field is influenced by the external approach of an object, e.g. by the approach of the coupling electrode assembly described below, the electrical measuring capacitance measured by the evaluation unit is reduced at the respective intersection point and detected, and can be associated with a location on the detection surface due to the electrode structure and arrangement of intersection points, which is structured in rows and columns.

According to the present disclosure, the input device includes a handling means, which is disposed on the detection surface in a manner movable along an adjustment path, in order to perform an operating input when the handling means is moved, in particular when the handling means is being touched by an operator. For example, this is a handling means that is mounted so as to be translationally movable along a direction parallel to the detection surface. Preferably, the handling means is mounted on the detection surface in a manner rotatable about a rotation axis orthogonal to the detection surface, thus qualifying the input device as a rotary adjuster.

According to the present disclosure, a coupling electrode assembly is further provided, which is at least partially moved synchronously with the handling means and which, for example, is at least partially, preferably completely, attached to a rotary knob substantially forming the handling means. The coupling electrode assembly is arranged in an electrically insulated manner with respect to the operator while they touch the handling means, so that an electric charge equalization between the operator and the coupling electrode assembly is excluded according to the present disclosure. The coupling electrode assembly substantially consists of a conductive material. The coupling electrode assembly has a first portion and at least one second portion, which are electrically connected to each other, e.g. coupled in an electrically conducting or capacitive manner. At least one position along the adjustment path of the handling means resulting from the movability of the handling means is provided, in which a first portion of the coupling electrode assembly is disposed adjacent to a first electrode of the array in order to enable a capacitive coupling between the first portion and the first electrode, and at least one second portion of the coupling electrode assembly is disposed adjacent to a second electrode of the array that differs from the first electrode in order to enable a capacitive coupling between the second portion and the second electrode.

In order to be able to detect several positions, several first electrodes that can be selectively contacted by the evaluation unit and several second electrodes that can be selectively contacted by the evaluation unit are in each case preferably provided and arranged in such a way that several positions along the adjustment path of the handling means are detectable by the evaluation unit given a corresponding position of the handling means, i.e. that associated first electrodes that are different from position to position are in each case provided, and associated second electrodes that are different from position to position are in each case provided, in order to detect the respective position.

According to the present disclosure, the evaluation unit is configured to generate a first measuring field emanating from at least the first electrode and to apply a predetermined electric potential to the second electrode in a first measuring step, in order to influence the first measuring field emanating from the first electrode by means of the capacitive coupling and the electric connection to the first portion.

According to the present disclosure, the evaluation unit is further configured to generate a second measuring field emanating from at least the second electrode and to apply a predetermined electric potential to the first electrode in a second measuring step, in order to influence the second measuring field emanating from the second electrode by means of the capacitive coupling and the electric connection to the second portion. Preferably, the first and second measuring steps are separated in time, i.e. they take place sequentially.

For example, the predetermined electric potential is the earth or ground potential or a fixed potential, such as 5 V, 10 V or 12 V. For example, the predetermined electric potential changes during the measuring process on the first electrode, e.g. using a Schmitt trigger or the like.

According to the present disclosure, the electronic evaluation unit is configured for determining both the influence on the first measuring field and on the second measuring field and for providing in each case an associated detection result, i.e. a first detection result associated with the influence on the first measuring field and a second detection result associated with the influence on the second measuring field. It is further configured for determining, from the first and/or the second detection result, preferably from both, position and/or movement information of the handling means and to output the latter, for example, for performing a control or switching function. For example, the two detection results are compared, and a position information or movement information is outputted only in the case of a minimum conformity. In another configuration, the position information or movement information is determined by interpolation of the first and second detection results.

According to the present disclosure, one first and second measuring step are to be provided, respectively, for at least one position, in which, on the one hand, the measuring field stemming from the first electrode is influenced by means of the capacitive coupling caused by means of the second electrode and this influence is detected, and, on the other hand, the measuring field stemming from the second electrode is influenced by means of the capacitive coupling caused by means of the first electrode. Therefore, a redundant capacitive influence on two different capacitive measuring fields, which are preferably spaced apart from each other in space, is used for position detection, whereby its accuracy and/or reliability can be enhanced.

In the process, the conceptual advantage of the capacitive coupling by means of the array electrodes is maintained, namely that the respective measuring field, under constant and predetermined conditions, can be influenced depending on the position in order to obtain a more reliable position detection. In contrast to a coupling electrode connected to the hand of an operator in an electrically conducting manner, the issue of a quality of the electrical connection between the operator and the coupling electrode being dependent on external conditions, such as skin resistance, is eliminated. With a simple design, the solution according to the present disclosure increases the reproducibility and reliability of the position detection by not only providing a first and second detection result, according to the present disclosure, but also by providing these two detection results by capacitive application to the coupling electrode assembly in different locations.

Since, by means of the coupling electrode assembly, at least two measuring fields are capacitively influenced and these influences are detected, according to the present disclosure, in order to obtain position information, i.e. the mutual influence of the measuring fields generated by the respective electrodes by the respective other electrodes is the basis of position detection, the functional reliability of the input device can be increased because several, in particular equivalent, detection results can be used for determining the position and/or movement information. In addition, a particularly space-saving design of the input device thus becomes possible, because an additional electrode, which is provided especially for influencing the measuring fields, can be dispensed with.

Furthermore, the input device described herein may be freely positioned on any commercially available touchpad or touchscreen, e.g. with a rectangular grid, i.e. electrode array, without any loss of accuracy in determining position and/or movement information.

According to a preferred embodiment of the input device, the clear distance between the detection surface and the second portion and the clear distance between the detection surface and the first portion for each position are in each case smaller than a minimum distance of 1 mm, preferably smaller than 0.5 mm and more preferably smaller than 0.1 mm. According to another embodiment, the distance between the first portion and the second portion is at least twice as large as the minimum distance.

According to another embodiment, the second portion or the entirety of the second portions has a surface, relative to a plane parallel to the detection surface, which is greater than the surface of the first portion relative to the same plane.

According to a preferred embodiment, the position-dependent variation of the capacitive coupling of the coupling field formed between the second electrode and the second portion over the entire adjustment range of the handling means corresponds to the variation of the capacitive coupling of the coupling field formed between the first electrode and the first portion. "Corresponding" means a deviation in the variation not exceeding 20 percent, preferably 10 percent.

Preferably, it is provided that the second portion or portions are connected in an electrically conducting manner to the first portion via one or more conductor portions of the coupling electrode assembly, which is or are spaced further apart from the detection surface than the first portion and the second portion.

According to another embodiment, several second portions are provided for improving the coupling, which are distributed about the rotation axis of the input device configured as a rotary adjuster.

Preferably, the first portion and the second portion are disposed in a common plane which is parallel to the detection surface.

In one embodiment, the potential is applied to several, preferably all, second electrodes, with the exception of the first electrode provided for generating the measuring field. Preferably, the evaluation unit is configured to determine the second electrodes most closely adjacent to the second portion depending on a position detection directly precedent in time, in order to apply to this determined second electrode the predetermined electric potential.

Furthermore, the present disclosure relates to the use of the input device in one of the above-described embodiments in a motor vehicle.

The present disclosure further relates to a method for evaluating the position of a handling means of an input device with the following steps. In a step of providing, the input device with a capacitive detection device is provided, which has a detection surface while forming an array of electrodes associated with the detection surface, with an electronic evaluation unit, which is electrically connected to the electrodes, in order to form, by means of the array of electrodes, an associated array of electrical measuring fields for the spatially resolving detection of a capacitive influence on the detection surface, and with a handling means, which is movably disposed on the detection surface, in order to perform an operating input in case of a movement while the handling means is touched by an operator. The input device provided has a coupling electrode assembly, which is at least partially moved along with the handling means and which is disposed in an electrically insulated manner with respect to the operator while they touch the handling means, and at least one position of the handling means is provided in which a first portion of the coupling electrode assembly is disposed adjacent to a first electrode of the array, and at least one second portion of the coupling electrode assembly electrically connected to the first electrode is disposed adjacent to a second electrode of the array that differs from the first electrode, in order to enable a capacitive coupling between the second portion and the second electrode.

In a first generation and application step, a first electric measuring field emanating from at least the first electrode is generated by means of the evaluation unit and a predetermined electric potential is applied to the second electrode by means of the evaluation unit, in order to influence the first measuring field by means of the capacitive coupling and the electric connection to the first portion provided by the coupling electrode assembly.

In a second subsequent generation and application step, a second electric measuring field emanating from the second electrode is generated by means of the evaluation unit and a predetermined electric potential is applied to the first electrode by means of the evaluation unit, in order to influence the second measuring field by means of the capacitive coupling and the electric connection to the second portion provided by the coupling electrode assembly.

The respective influence on the first and the second measuring field is detected by means of the evaluation unit and a first and second detection result is provided during the corresponding generation and application step. Position and/or movement information of the handling means is determined, by means of the evaluation unit, from the first and/or second detection result in a determination step.

In a subsequent evaluation step, the data obtained in the preceding detection steps are used for obtaining position and/or movement information of the handling means.

The solution according to the present disclosure makes it possible that the respective measuring field can be influenced depending on the position, not only under constant and predetermined conditions, in order to obtain a more reliable position detection. In contrast to a coupling electrode connected to the hand of an operator in an electrically conducting manner, the issue of the quality of the electrical connection between the operator and the coupling electrode being dependent on external conditions, such as skin resistance, is eliminated. Furthermore, the reproducibility and reliability of position detection is increased with a simple design by the solution according to the present disclosure, because it draws upon the mutual influence of the measuring fields generated by the respective electrodes by the respective other electrodes.

According to the present disclosure, one first and second measuring step are provided, respectively, for at least one position, in which, on the one hand, the measuring field stemming from the first electrode is influenced by means of the capacitive coupling caused by means of the second electrode and this influence is detected, and, on the other hand, the measuring field stemming from the second electrode is influenced by means of the capacitive coupling caused by means of the first electrode.

Preferably, several of these positions are provided along the adjustment path of the handling means, wherein associated first electrodes that are different from position to position are in each case provided, and associated second electrodes that are different from position to position are in each case provided, in order to detect the respective position.

Therefore, a redundant capacitive influence on two different capacitive measuring fields, which are preferably spaced apart from each other in space, is used for position detection, whereby its accuracy and/or reliability can be enhanced. On the whole, the functional reliability can be enhanced because several equivalent detection results can be used for determining the position and/or movement information. In addition, a particularly space-saving design of the input device thus becomes possible, because an additional electrode, which is provided especially for influencing the measuring fields, can be dispensed with.

Furthermore, the input device described herein may be freely positioned on any commercially available touchpad or touchscreen, e.g. with a rectangular electrode grid, without any loss of accuracy in determining position and/or movement information.

According to a preferred variation of the above-described method, a selection step, which precedes the application step in time, is provided, in which the second electrodes adjacent to the second portion are determined depending on a position detection directly precedent in time, in order to apply to this determined second electrode the predetermined electric potential in the subsequent application step.

The present disclosure is explained further with reference to the following Figures. The Figures are to be understood only as examples and merely represent preferred embodiments. In the Figures.

Figure 1:
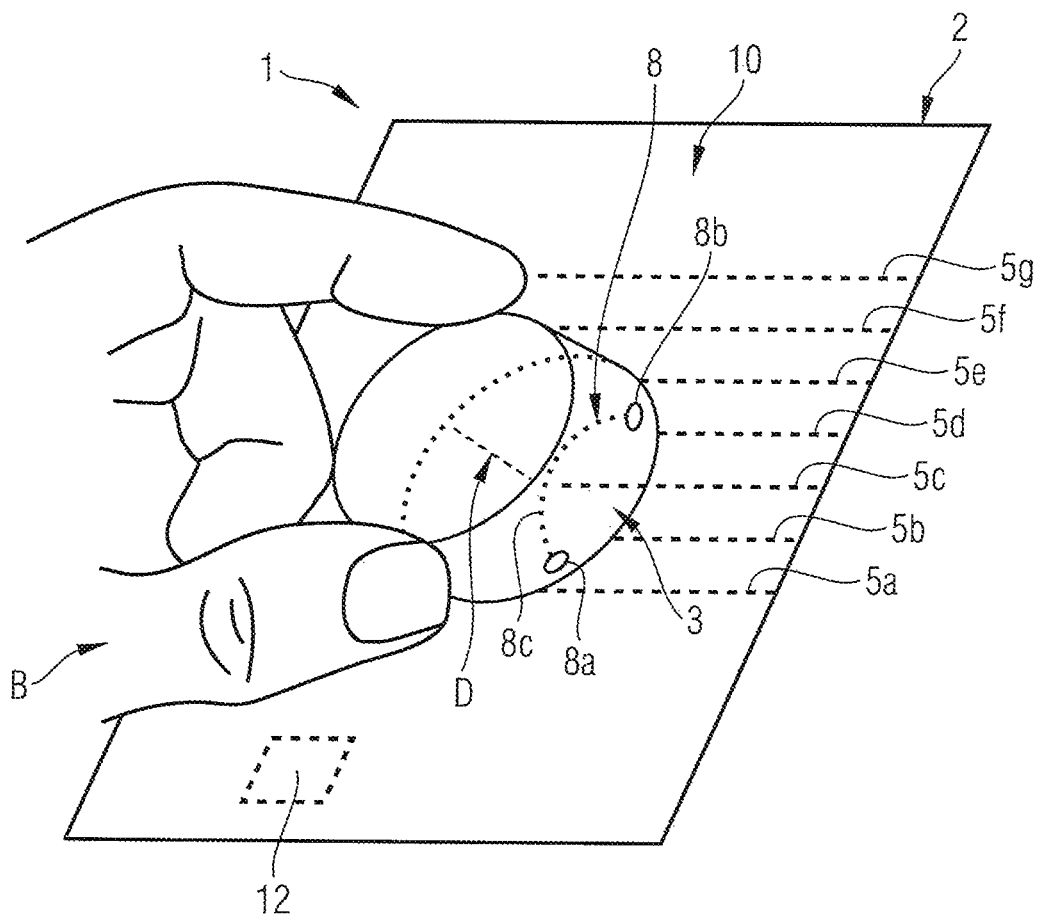
FIG. 1 shows a perspective top view of an embodiment of the input device 1 according to the present disclosure.

FIG. 1 shows an input device 1 according to the present disclosure, with a touchscreen functioning as a capacitive detection device 2. The detection device 2 defines a detection surface 10 facing towards the operator B, on which a handling means 3 is disposed so as to be mounted rotatably about a rotation axis D, thus forming a so-called rotary adjuster. The capacitive detection device 2 has an array of electrodes 5a to 5g, which is not depicted in full and to scale in the Figures and is only supposed to serve for schematic illustration of the general structure. An electronic evaluation unit 12 is electrically connected to the electrodes 5a to 5g, which, for generating an associated measuring field, applies a potential V1 to each of the electrodes selectively and in a sequence in time, in order to detect a touch by the operator B or, depending on the position of the respective electrode relative to the handling means 3, a position of the handling means 3, based on the influence on the measuring field. For influencing the respective measuring field, the handling means 3 has on the side thereof facing towards the detection surface 10 a coupling electrode assembly 8, which is disposed in an electrically insulating manner with respect to the operator B while they are touching the handling means 3. Several positions are provided, which are, in particular, evenly distributed across the rotary adjustment range of the handling means 3 and of which one possible position is shown in each case in the Figures, and in which one first portion 8a of the coupling electrode assembly 8 is in each case disposed adjacent to a first electrode 5a of the array, in order thus to obtain a capacitive coupling between the first portion 8a and the first electrode 5a, and at least one second portion 8b of the coupling electrode assembly, which is electrically connected to the first portion 8a via the conductor portion 8c, is disposed adjacent to a second electrode 5d of the array that differs from the first electrode 5a, in order to obtain a capacitive coupling between the second portion 8b and the second electrode 5d. In this case, the evaluation unit 12 is configured to generate a first measuring field emanating from the first electrode 5a and to apply a predetermined electric potential V0 to the second electrode 5d, in order to influence the first measuring field emanating from the first electrode 5a by means of the capacitive coupling existing between the second electrode 5d and the second portion 8b and by means of the electric connection 8c to the first portion 8a. The evaluation unit 12 is further configured to generate a second measuring field emanating from the second electrode 5d and to apply a predetermined electric potential V0 to the first electrode 5a, in order to influence the second measuring field emanating from the second electrode 5d by means of the capacitive coupling existing between the first electrode 5a and the first portion 8a and by means of the electric connection 8c to the second portion 8b.

Due to the fact that the electronic evaluation unit 12 is configured for detecting the respective influences on the measuring fields, dual and redundant position information is obtained for the respective position of the handling means 3. The principle of the present disclosure will explained again with reference to another embodiment shown in FIG. 2.

The latter substantially differs from the embodiment shown in FIG. 1 in that the coupling electrode assembly 8 has not only one, but two, second portions 8b which are connected in an electrically conducting manner with one another and with the first portion 8a of the coupling electrode assembly 8 via several conductor portions 8c. In this case, the evaluation unit 12 is configured to generate a first measuring field emanating from at least the first electrode 5a by means of the potential V1 and to apply a predetermined electric potential V0 to the second electrodes 5b to 5e, in order to influence the first measuring field stemming from the first electrode 5a by means of the capacitive coupling existing between the second electrodes 5b to 5e, particularly between the respective most closely adjacent second electrodes 5c, 5d, and the respective second portion 8b and by means of the electric connections 8c to the first portion 8a. The evaluation unit 12 is further configured to generate a second measuring field emanating from one of the second electrodes 5c, 5d by means of the potential V1 and to apply a predetermined electric potential V0 to the first electrode 5a, in order to influence the second measuring field stemming from the one of the second electrodes 5c, 5d by means of the capacitive coupling existing between the first electrode 5a and the first portion 8a and by means of the electric connections 8c of the second portion 8b.

Due to the fact that the electronic evaluation unit 12 is configured for detecting the respective influence on the measuring field and thus the change of the latter, dual and redundant position information is again obtained with respect to the respective position of the handling means 3.

Figure 2:
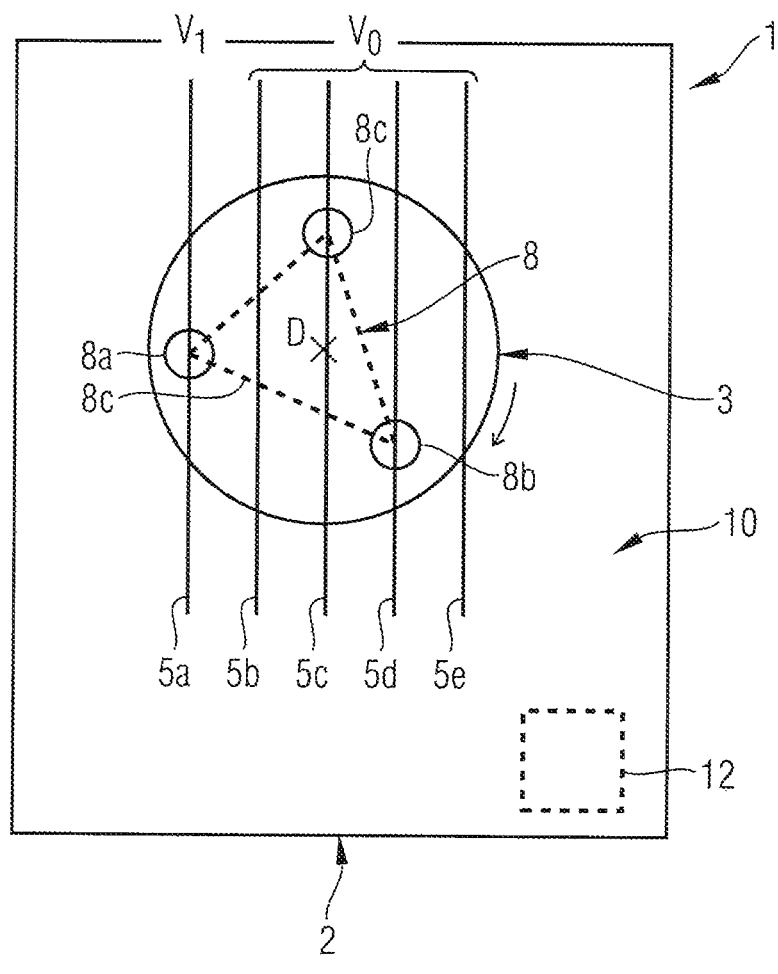
FIG. 2 shows a vertical top view of another embodiment of the input device 1 according to the present disclosure.
Figure 3:
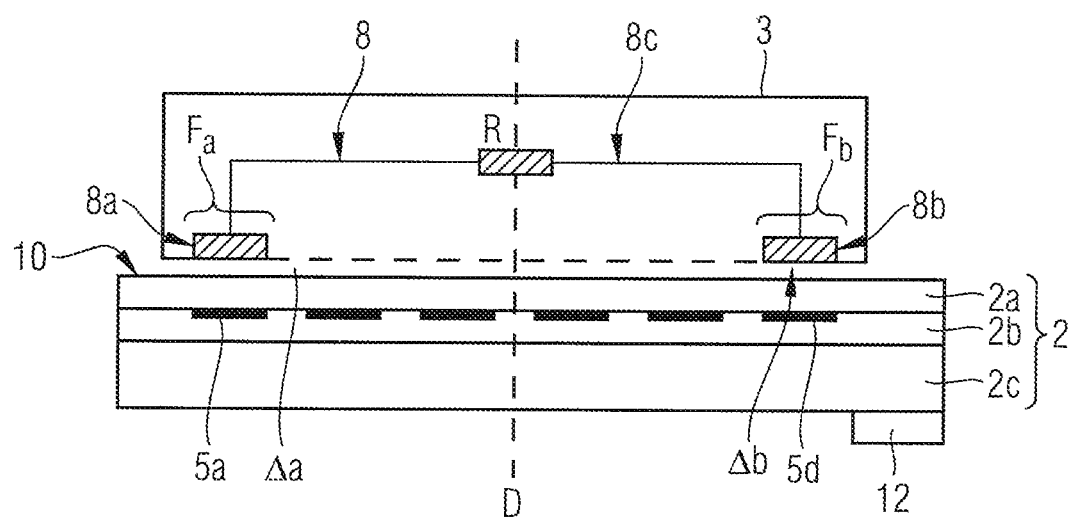
FIG. 3 shows a sectional view of the embodiment from FIG. 2.

FIG. 3 is a sectional view associated with FIG. 2. It substantially serves for illustrating the coupling electrode assembly 8, which is attached to the handling means 3 in its entirety and moved along with it. The first portion 8a of the coupling electrode assembly 8, which is situated across from the first electrode 5a with the clear distance $\Delta a$, has a surface Fa with respect to a plane with respect to the detection surface 10 that is smaller than the surface Fb of the second portion 8b relative to the same plane, and thus also smaller than the entirety of the surfaces Fb of the two second portions 8b. The clear distance $\Delta a$ between the detection surface 10 and the second portion 8b and the clear distance $\Delta b$ between the detection surface 10 and the first portion 8a are in each case smaller than a minimum distance of 0.1 mm. The conductive connection between the second portions 8b and the first portion 8a of the coupling electrode assembly 8 is realized by means of several electrical conductor portions 8c which, as symbolized by the ohmic resistance R, are generally lossy. The detection device 2 has an upper transparent cover layer 2a forming the detection surface 10, a transparent layer 2b forming the array of electrodes, and an electronic pixel matrix display layer 2c disposed thereunder.

Figure 4A:
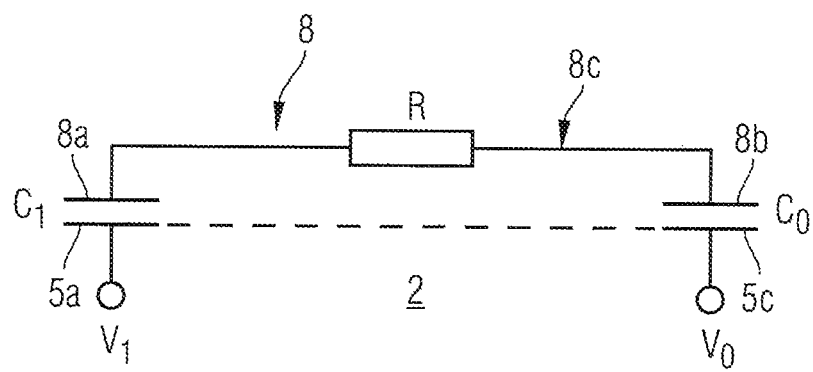
FIG. 4a shows an equivalent circuit diagram for an embodiment of the input device according to the present disclosure based on FIG. 3, with a self-capacitance design.
Figure 4B:
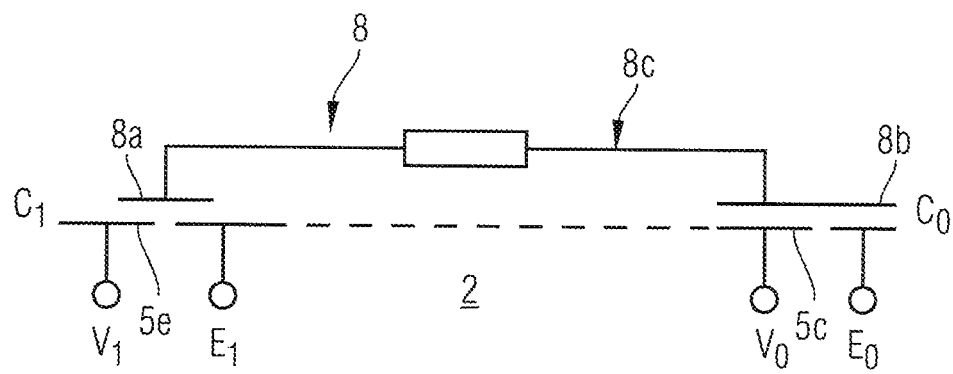
FIG. 4b shows an equivalent circuit diagram for an embodiment of the input device according to the present disclosure based on FIG. 3, with a mutual-capacitance design.

The equivalent circuit diagrams, based on which the operation of the input device 1 according to the present disclosure is described again, are shown in the FIGS. 4a and 4b. In this case, the embodiment shown in FIG. 4a is a detection device 2 with a self-capacitance design at a time of the electrode 5a generating a measuring field. In this case, the first electrical measuring field is generated only by applying the potential V1 to the first electrode 5a. Also, the capacitive coupling between the second electrode 5c and the second portion 8b of the coupling electrode assembly 8 takes place, so that the first portion 8a is charged via the conductor portion 8c in order to influence the measuring field generated exclusively by the first electrode 5a. In the embodiment shown in FIG. 4b, the detection device 2 is configured with a mutual-capacitance design, at a time of the electrode 5a generating a measuring field. That is, the first electrode 5a, to which a potential V1 is applied, is associated with a counter-electrode with the counter-potential E1, with the measuring field forming between the two. The second electrode 5c is also associated with a counter-electrode to which the potential E0 is applied, and the second portion 8b of the coupling electrode assembly 8 is coupled into the field formed between the two, also referred to as the coupling field.

Figure 5:
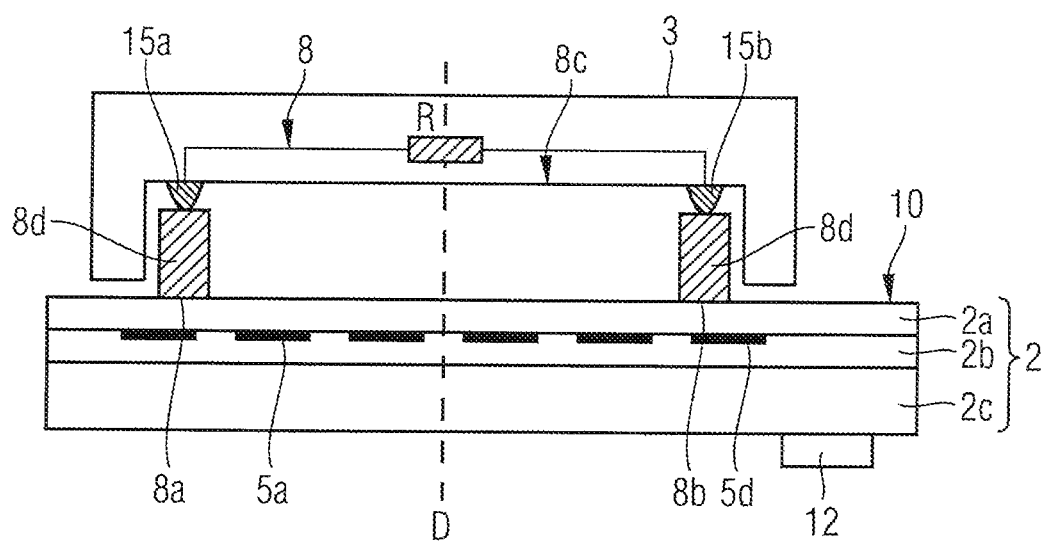
FIG. 5 shows a sectional view of another embodiment of the input device 1 according to the present disclosure.

FIG. 5 shows another embodiment in which, in contrast to the embodiments of FIGS. 1 to 4b, the coupling electrode assembly 8 is synchronously moved along with the handling means 3, not completely, but only partially. The stationary part of the coupling electrode assembly 8 has several conductor portions 8d provided for each position to be detected, which are stationary relative to the detection surface 10, extend substantially orthogonally relative to the detection surface 10 and are electrically insulated from one another, and whose end faces, on the one hand, are disposed most closely adjacent to one of the electrodes 5a, 5d of the detection device 2, and whose opposite end face, given a corresponding position of the handling means 2, faces most closely adjacent towards the part of the coupling electrode assembly 8 attached to the handling means. Thus, given a corresponding position of the handling means 3, a capacitive coupling 15a and 15b respectively forms between the stationary part 8d of the coupling electrode assembly 8 and the moved part 8c of the coupling electrode assembly 8. Alternatively, this capacitive coupling 15a, 15b could be realized by a sliding contact, i.e. an electrically conductive contact.

Figure 6A:
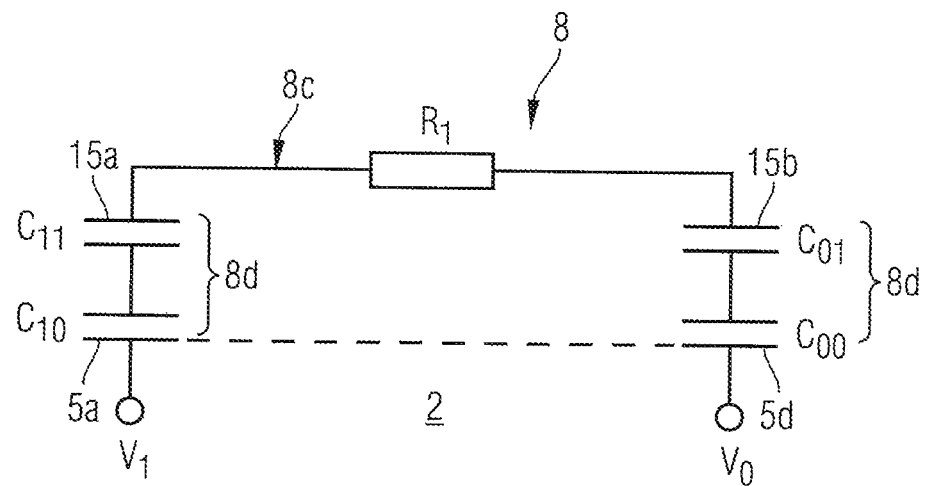
FIG. 6a shows an equivalent circuit diagram for an embodiment of the input device according to the present disclosure based on FIG. 5, with a self-capacitance design.
Figure 6B:
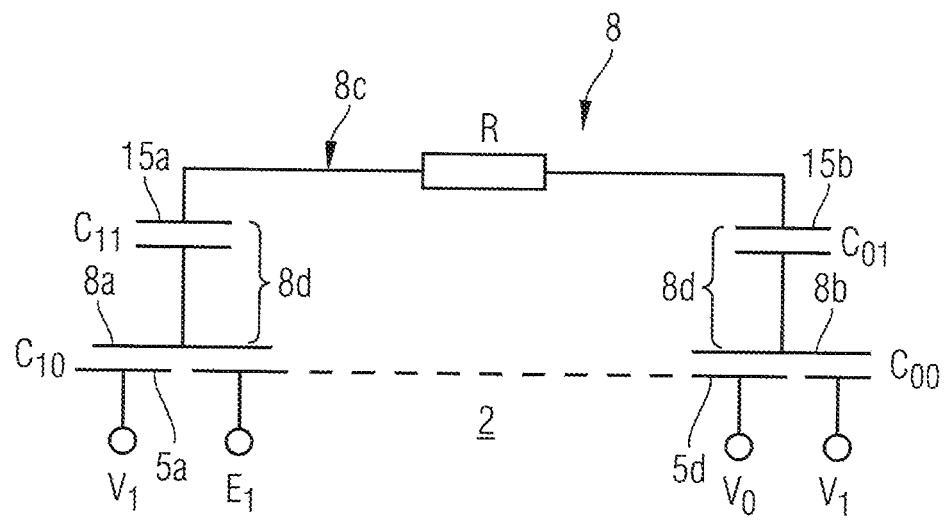
FIG. 6b shows an equivalent circuit diagram for an embodiment of the input device according to the present disclosure based on FIG. 5, with a mutual-capacitance design.

The corresponding equivalent circuit diagram for the two possible designs of the detection device 4 is shown, with respect to the self-capacitance structure, in FIG. 6a, and with respect to the mutual-capacitance structure, in FIG. 6b, which differ from the equivalent circuit diagrams of the FIGS. 4a and 4b only in the capacitive couplings 15a and 15b and the additional capacitances C11 and C01.

The invention claimed is:

1. An input device, comprising:
  a capacitive detector, which has a detection surface while forming an array of electrodes associated with the detection surface;
  an electronic evaluation unit, which is electrically connected to the array of electrodes in order to form an associated array of electrical measuring fields for spatially resolving detection of a capacitive influence on the detection surface;
  a handling means, which is disposed on the detection surface in a manner movable along an adjustment path in order to perform an operating input by means of a movement by an operator;
  a coupling electrode assembly, which is at least partially moved along with the handling means and which is disposed in an electrically insulated manner with respect to the operator while they touch the handling means, where at least one position of the handling means is provided in which a first portion of the coupling electrode assembly is disposed adjacent to a first electrode of the array of electrodes, in order to obtain a capacitive coupling between the first portion and the first electrode, and at least one second portion of the coupling electrode assembly electrically connected to the first portion is disposed adjacent to a second electrode of the array of electrodes that differs from the first electrode, in order to obtain a capacitive coupling between the second portion and the second electrode;
  wherein the evaluation unit is configured to generate a first electrical measuring field emanating from at least the first electrode and to apply a predetermined electric potential ($V_0$) to the second electrode in a first measuring step in order to influence the first electrical measuring field by means of the capacitive coupling and the electric connection to the first portion provided by the coupling electrode assembly;
  wherein the evaluation unit is configured to generate a second electrical measuring field emanating from the second electrode and to apply a predetermined electric potential ($V_0$) to the first electrode in a second measuring step in order to influence the second electrical measuring field by means of the capacitive coupling and the electric connection to the second portion provided by the coupling electrode assembly;
  wherein the electronic evaluation unit is further configured to determine both the influence on the first electrical measuring field and the influence on the second electrical measuring field and associate them to a first and a second detection result, and to obtain and output position or movement information of the handling means from the first or second detection result.

2. The input device of claim 1, wherein a distance ($\Delta b$) between the detection surface and the second portion and a distance ($\Delta a$) between the detection surface and the first portion are in each case smaller than a minimum distance of 1 mm.

3. The input device of claim 2, wherein a distance in an orthogonal direction to the detection surface between the first portion and the second portion is at least twice as large as the minimum distance.

4. The input device of claim 1, wherein the second portion has a surface ($F_b$), relative to a plane parallel to the detection surface, which is greater than the surface ($F_a$) of the first portion relative to the same plane.

5. The input device of claim 1, wherein the second portion or portions are electrically connected to the first portion via one or more conductor portions of the coupling electrode assembly, which is or are spaced further apart from the detection surface than the first portion and the second portion.

6. An input device of claim 1, wherein the handling means is mounted on the detection surface in a manner movable about a rotation axis orthogonal to the detection surface.

7. The input device of claim 6, wherein several second portions are provided which are distributed about the rotation axis.

8. The input device of claim 1, wherein the first portion and the second portion are disposed in a common plane which is parallel to the detection surface.

9. The input device of claim 1, wherein the evaluation unit is configured to determine second electrodes most closely adjacent to the second portion depending on a position detection directly precedent in time, in order to apply to this determined second electrode the predetermined electric potential ($V_0$).

10. The input device of claim 1, wherein several first electrodes that can be selectively contacted by the evaluation unit and several second electrodes that can be selectively contacted by the evaluation unit are in each case provided and arranged in such a way that several positions along the adjustment path of the handling means are detectable by the evaluation unit given a corresponding position of the handling means.

11. The input device of claim 1, wherein the capacitive detector is a touchpad or a touchscreen.

12. The input device of claim 1 configured to use in a motor vehicle.

13. A method for evaluating a position of a handling means of an input device, comprising:
  providing the input device with a capacitive detector, which has a detection surface while forming an array of electrodes associated with the detection surface, with an electronic evaluation unit, which is electrically connected to the array of electrodes, in order to form an associated array of electrical measuring fields for the spatially resolving detection of a capacitive influence on the detection surface, and with a handling means, which is disposed on the detection surface in a manner movable along an adjustment path, in order to perform an operating input in case of a movement, particularly while touching the handling means by an operator, with a coupling electrode assembly, which is at least partially moved along with the handling means and which is disposed in an electrically insulated manner with respect to the operator while they touch the handling means, and at least one position of the handling means is provided in which a first portion of the coupling electrode assembly is disposed adjacent to a first electrode of the array of electrodes in order to enable a capacitive coupling between the first portion and the first electrode, and at least one second portion of the coupling electrode assembly electrically connected to the first portion is disposed adjacent to a second electrode of the array that differs from the first electrode in order to enable a capacitive coupling between the second portion and the second electrode;
  generating by means of the evaluation unit a first electrical measuring field emanating from at least the first electrode and applying a predetermined electric potential ($V_0$) to the second electrode by means of the evaluation unit in a first measuring step, in order to influence the first electric measuring field by means of the capacitive coupling and the electric connection to the first portion provided by the coupling electrode assembly;
  generating by means of the evaluation unit a second electrical measuring field emanating from the second electrode and applying a predetermined electric potential ($V_0$) to the first electrode by means of the evaluation unit in a second measuring step, in order to influence the second electrical measuring field by means of the capacitive coupling and the electric connection to the second portion provided by the coupling electrode assembly;
  determining the influence on the first electrical measuring field and the influence on the second electrical measuring field by means of the evaluation unit and providing an associated first and second detection result;
  determining, by means of the evaluation unit, the position or movement information of the handling means from the first or second detection result.

14. The method of claim 13, with a selection step in which the second electrodes adjacent to the second portion are determined depending on a position detection directly precedent in time, in order to apply to this determined second electrode the predetermined electric potential ($V_0$) in a subsequent application step.

* * * * *